US007803676B2

(12) United States Patent
Park et al.

(10) Patent No.: US 7,803,676 B2
(45) Date of Patent: Sep. 28, 2010

(54) SEMICONDUCTOR DEVICE AND METHOD OF FABRICATING THE SAME

(75) Inventors: Jong-ho Park, Incheon (KR); Chang-Ki Jeon, Gimpo-si (KR); Hyi-Jeong Park, Seoul (KR); Hye-mi Kim, Seoul (KR)

(73) Assignee: Fairchild Korea Semiconductor, Ltd., Bucheon-si (KR)

( * ) Notice: Subject to any disclaimer, the term of this patent is extended or adjusted under 35 U.S.C. 154(b) by 0 days.

(21) Appl. No.: 12/414,172

(22) Filed: Mar. 30, 2009

(65) Prior Publication Data

US 2009/0250753 A1    Oct. 8, 2009

(30) Foreign Application Priority Data

Apr. 8, 2008    (KR)    ............... 10-2008-0032705

(51) Int. Cl.
*H01L 21/8238* (2006.01)
*H01L 21/331* (2006.01)
*H01L 21/8222* (2006.01)

(52) U.S. Cl. .................. 438/199; 438/202; 438/203; 438/309

(58) Field of Classification Search .......... 438/286, 438/207, 202, 234, 268, 269, 270–274, 238, 438/239, 386, 399, 250, 242, 393, 199, 200, 438/201, 203, 309
See application file for complete search history.

(56) References Cited

U.S. PATENT DOCUMENTS

| 4,957,874 | A | 9/1990 | Soejima |
| 5,017,995 | A | 5/1991 | Soejima |
| 5,028,557 | A | 7/1991 | Tsai et al. |
| 5,319,234 | A | 6/1994 | Uga et al. |
| 5,466,615 | A | 11/1995 | Tsai |
| 5,557,131 | A | 9/1996 | Lee |
| 5,943,564 | A | 8/1999 | Chen et al. |
| 6,541,325 | B2 * | 4/2003 | Huang et al. ............... 438/207 |
| 6,551,890 | B2 * | 4/2003 | Dekker et al. .............. 438/329 |
| 7,115,502 | B2 * | 10/2006 | Jan ........................... 438/659 |
| 7,488,662 | B2 * | 2/2009 | Zhang et al. ............... 438/309 |

* cited by examiner

*Primary Examiner*—Chuong Anh Luu
(74) *Attorney, Agent, or Firm*—Thomas R. FitzGerald, Esq.; Hiscock & Barclay, LLP

(57) ABSTRACT

Provided are a semiconductor device and a method of fabricating the semiconductor device. The semiconductor device using a DMOS device includes: a semiconductor substrate, in which a first conductive type well is formed; a first conductive type gate electrode formed on the semiconductor substrate with a gate insulating layer intervening between the gate electrode and the semiconductor substrate; a second conductive type body electrode formed on the semiconductor substrate and separated from the gate electrode; a first conductive type drain electrode formed on the semiconductor substrate and separated from the gate electrode and the body electrode; a second conductive type first body region formed in the well under the body electrode; a second conductive type second body region extending from the first body region to the gate insulating layer and formed in the well; a first conductive type source region formed in the second body region and extending from the first body region to the gate insulating layer; and a first conductive type source electrode extending from the source region to surround the gate electrode on the semiconductor substrate with an insulating layer intervening between the source electrode and gate electrode.

12 Claims, 16 Drawing Sheets

SEMICONDUCTOR DEVICE AND METHOD OF FABRICATING THE SAME

CROSS-REFERENCE TO RELATED PATENT APPLICATIONS

This application claims the benefit of Korean Patent Application No. 10-2008-0032705, filed on Apr. 8, 2008, in the Korean Intellectual Property Office, the disclosure of which is incorporated herein in its entirety by reference.

BACKGROUND OF THE INVENTION

1. Field of the Invention

The present invention relates to a semiconductor device and a method of fabricating the semiconductor device, and more particularly, a semiconductor device that is a double-diffused metal-oxide-semiconductor (DMOS) device that is fabricated using a double-polysilicon process and a method of fabricating the semiconductor device.

2. Description of the Related Art

Bipolar transistors may have a fast switching speed and a fast input/output speed. Complementary metal-oxide-semiconductor (CMOS) transistors may have low power consumption, a small noise margin, and a high integration density. Therefore, various types of bipolar-CMOS (BiCMOS) devices, in which the bipolar transistors and the CMOS transistors are formed on one substrate, are being suggested. Examples of the BiCMOS devices are disclosed in U.S. Pat. No. 5,943,564, U.S. Pat. No. 5,557,131, U.S. Pat. No. 5,466,615, U.S. Pat. No. 5,319,234, U.S. Pat. No. 5,028,557, U.S. Pat. No. 4,957,874, and U.S. Pat. No. 5,017,995.

On the other hand, in a case where a BiCMOS device having a high voltage property is required, a BiCDMOS device in which a DMOS transistor is formed on one substrate in addition to the bipolar transistor and the CMOS transistor, is necessary. However, the inventions disclosed in the above U.S. Pat. No. 5,943,564, U.S. Pat. No. 5,557,131, U.S. Pat. No. 5,466,615, U.S. Pat. No. 5,319,234, U.S. Pat. No. 5,028,557, U.S. Pat. No. 4,957,874, and U.S. Pat. No. 5,017,995 do not provide the DMOS transistor. This is because fabrication processes become complex and fabrication costs increase due to the use of a number of mask layers in order to provide the DMOS transistor on the same substrate as those of the bipolar transistor and the CMOS transistor. Therefore, a semiconductor device that may improve functions while reducing fabrication costs by using a small number of mask layers, and a method of fabricating the semiconductor device are required.

SUMMARY OF THE INVENTION

The present invention provides a semiconductor device that may form a bipolar-CMOS-DMOS (BiCDMOS) device on one substrate while reducing fabrication costs of the semiconductor device.

The present invention also provides a method of fabricating a semiconductor device for forming a BiCDMOS device on a substrate while reducing fabrication costs.

According to an aspect of the present invention, there is provided a semiconductor device using a double-diffused metal-oxide-semiconductor (DMOS) device, the semiconductor device including: a semiconductor substrate, in which a first conductive type well is formed; a first conductive type gate electrode formed on the semiconductor substrate with an intervening a gate insulating layer between the gate electrode and the semiconductor substrate; a second conductive type body electrode formed on the semiconductor substrate and separated from the gate electrode; a first conductive type drain electrode formed on the semiconductor substrate and separated from the gate electrode and the body electrode; a second conductive type first body region formed in the well under the body electrode; a second conductive type second body region extending from the first body region to the gate insulating layer and formed in the well; a first conductive type source region formed in the second body region and extending from the first body region to the gate insulating layer; and a first conductive type source electrode extending from the source region to surround the gate electrode on the semiconductor substrate with an insulating layer intervening between the source electrode and gate electrode. The first body region may have a second conductive type concentration that is higher than that of the second body region. The semiconductor device may further include: a first contact hole pattern formed on the body electrode; a second contact hole pattern formed on the source electrode; and a third contact hole pattern formed on the drain electrode, wherein the first contact hole pattern and the second contact hole pattern are electrically connected to each other. The gate electrode, the body electrode, and the drain electrode may be formed of a first polysilicon layer, and the source electrode may be formed of a second polysilicon layer.

According to another aspect of the present invention, there is provided a semiconductor device including: a bipolar device, a complementary metal-oxide-semiconductor (CMOS) device, and a DMOS device formed on a semiconductor substrate and separated from each other in a transverse direction. The bipolar device may include: a second conductive type base electrode, a first conductive type collector electrode, and a first conductive type emitter electrode. The CMOS device may include: a first conductive type first gate electrode, a first conductive type first drain electrode, and a first conductive type first source electrode. The DMOS device may include: a second conductive type well formed in the semiconductor substrate; a first conductive type second gate electrode formed on the semiconductor substrate with a gate insulating layer intervening between the second gate electrode and the semiconductor substrate; a first conductive type body electrode formed on the semiconductor substrate and separated from the second gate electrode; a second conductive type second drain electrode formed on the semiconductor substrate and separated from the second gate electrode and the body electrode; a first conductive type first body region formed in the well under the body electrode; a first conductive type second body region of a first conductive type extending from the first body region to the gate insulating layer and formed in the well; a source region of a second conductive type formed in the second body region and extending from the first body region to the gate insulating layer; and a second conductive type second source electrode extending from the source region to surround the second gate electrode on the semiconductor substrate with an insulating layer intervening between the source electrode and the second gate electrode. The first gate electrode, the base electrode, the collector electrode, the second gate electrode, the second drain electrode, and the body electrode may be formed of a first polysilicon layer, and the emitter electrode, the first drain electrode, the first source electrode, and the second source electrode may be formed of a second polysilicon layer. The semiconductor device may further include: contact hole patterns formed on the collector electrode, the base electrode, the emitter electrode, the first source electrode, the first drain electrode, the second drain electrode, the body electrode, and the second source electrode. The contact hole patterns formed on the body electrode and the second source electrode may be electrically connected to each other.

According to another aspect of the present invention, there is provided a method of fabricating a semiconductor device, which forms a DMOS transistor including a gate electrode, a drain electrode, a body electrode, and a source electrode on a substrate, the method including: providing the substrate including an active region, on which the DMOS transistor will be formed; forming a gate insulating layer pattern on a portion of the substrate, on which the gate electrode will be formed; forming a first polysilicon layer on an entire substrate including the gate insulating layer pattern; injecting a high concentration of first conductive type impurities as ions onto portions of the first polysilicon layer, on which the gate electrode and the body electrode will be formed; injecting a high concentration of second conductive type impurities onto a portion of the first polysilicon layer, on which the drain electrode will be formed; forming the body electrode and the gate electrode by patterning the first polysilicon layer; performing a first thermal treatment of the substrate so as to form a first conductive type first impurity region in the substrate under the body electrode, and a second conductive type first impurity region in the substrate under the drain electrode; sequentially injecting a low concentration of first conductive type impurities and a low concentration of second conductive type impurities as ions onto the body electrode, the gate electrode, and portions between the body electrode and the gate electrode; performing a second thermal treatment of the substrate so as to form a second conductive type second impurity region and a first conductive type second impurity region between the gate electrode and the body electrode in the active region; forming a second polysilicon layer on an entire substrate including structures formed on the substrate; forming the source electrode by injecting a high concentration of second conductive type impurities onto a portion of the first polysilicon layer, on which the source electrode will be formed and by patterning the second polysilicon layer and performing a third thermal treatment of the substrate so as to form a second conductive type source region. The forming of the body electrode and the gate electrode may be performed by etching some of the substrate between the gate electrode and the body electrode to form a trench on the substrate when the first polysilicon layer is patterned.

According to another aspect of the present invention, there is provided a method of fabricating a semiconductor device, which is formed by forming a bipolar transistor including a base electrode, a collector electrode, and an emitter electrode, a CMOS transistor including a first gate electrode, a first drain electrode, and a first source electrode, and a DMOS transistor including a second gate electrode, a second drain electrode, a body electrode, and a second source electrode, on a semiconductor substrate and are separated from each other in a transverse direction, the method including: providing the semiconductor substrate including a first active region, on which the bipolar transistor will be formed, a second active region, on which the CMOS transistor will be formed, and a third active region, on which the DMOS transistor will be formed; forming a gate insulating layer pattern on portions of the substrate, on which the first gate electrode and the second gate electrode will be formed; forming a first polysilicon layer on an entire substrate including the gate insulating layer pattern; injecting a high concentration of first conductive type impurities as ions onto portions of the first polysilicon layer, on which the collector electrode, the first gate electrode, and the body electrode will be formed; injecting a high concentration of second conductive type impurities onto portions of the first polysilicon layer, on which the base electrode and the second drain electrode will be formed; forming the collector electrode, the base electrode, the first gate electrode, the body electrode, and the second gate electrode by patterning the first polysilicon layer; performing a first thermal treatment of the semiconductor substrate so as to form first conductive type first impurity regions in the substrate under the collector electrode and under the body electrode, and second conductive type first impurity regions in the substrate under the base electrode and the second drain electrode; injecting a low concentration of first conductive type impurities as ions onto the collector electrode, the first gate electrode, and both sides of the first gate electrode; injecting a low concentration of second conductive type impurities into the base electrode; sequentially injecting a low concentration of first conductive type impurities and a low concentration of second conductive type impurities as ions onto the body electrode, the second gate electrode, and portions between the body electrode and the second gate electrode; performing a second thermal treatment of the substrate so as to form a second conductive type second impurity region between the first impurity regions of the second conductive type in the first active region, to form first conductive type second impurity regions on both sides of the first gate electrode in the second active region, and to form a second conductive type second impurity region between the second gate electrode and the body electrode in the third active region and a first conductive type second impurity region surrounding the second conductive type second impurity region; forming a second polysilicon layer on an entire substrate including structures formed on the substrate; injecting a high concentration of the first conductive type impurities as ions onto portions of the second polysilicon layer, on which the emitter electrode, the first source electrode, and the first drain electrode will be formed, and performing a third thermal treatment of the substrate; and forming the emitter electrode, the first source electrode, the first drain electrode, and the second source electrode by patterning the second polysilicon layer.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
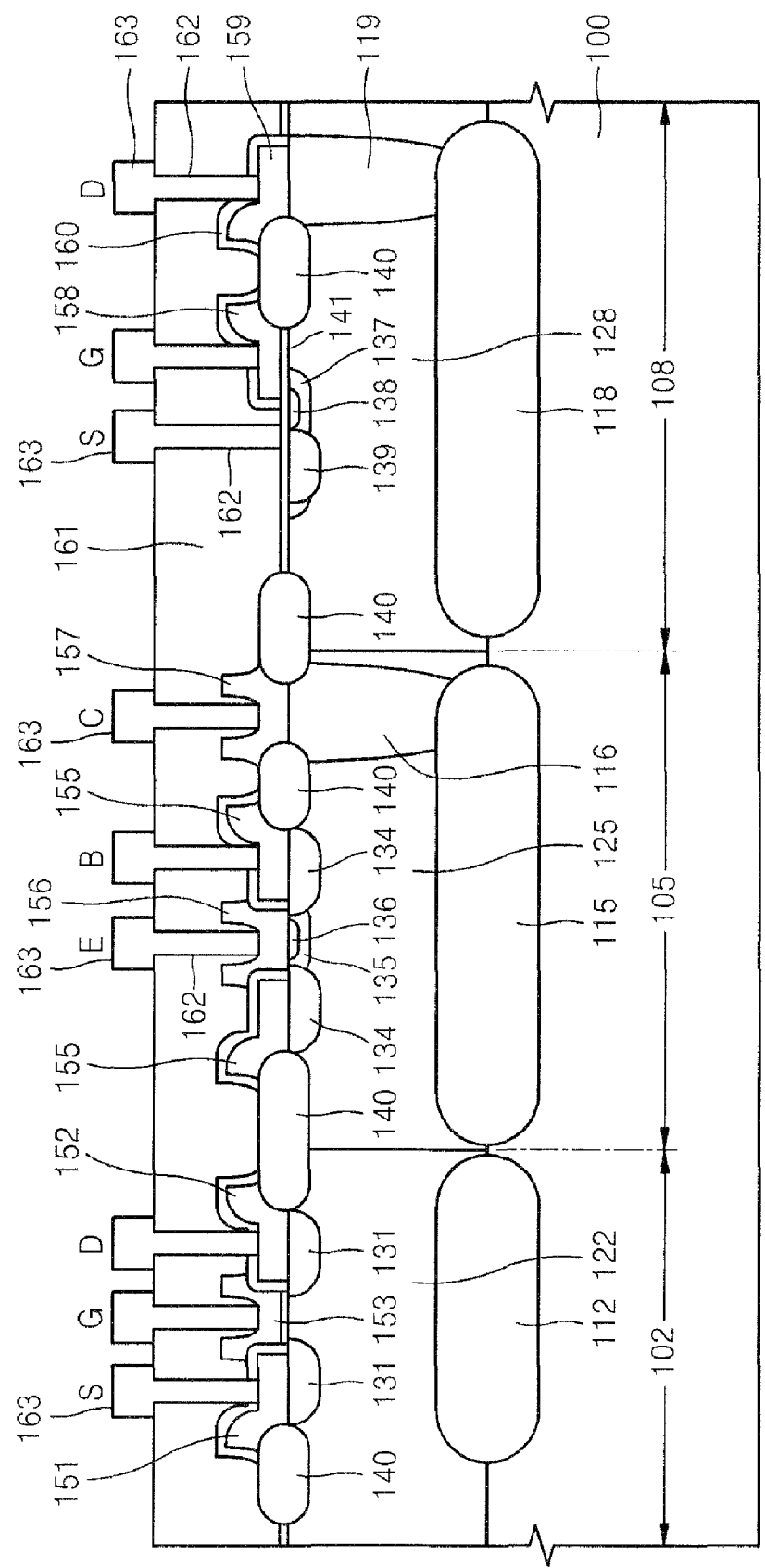
FIG. 1 is a cross-sectional view of bipolar-CMOS-DMOS (BiCDMOS) devices formed on a substrate.

The invention is described more fully hereinafter with reference to the accompanying drawings, in which exemplary embodiments of the invention are shown. This should not be construed as limiting the claims to the exemplary embodiments shown. Rather, these embodiments are provided to convey the scope of the invention to those of ordinary skill in the art. In the drawings, the size and relative sizes of elements and regions may be exaggerated for clarity.

Like reference numerals in the drawings denote like elements, and thus their description may not be repeated. It will also be understood that when a layer is referred to as being "on" another layer or substrate, it can be directly on the other layer or substrate, or intervening layers may also be present.

Relative terms such as "on" or "above", and "under" or "beneath" may be used herein to describe relations of some elements with respect to other elements as shown in the drawings. The relative terms can be understood to include other directions of the device in addition to directions shown in the drawings. For example, if a device is turned down in the drawings, elements described to exist on upper surfaces of other elements exist on lower surfaces of the other elements. Therefore, the term "on", as an example, can include the directions of "under" and "upper" independent upon directions of the drawings.

Terms used in the present specification are used to describe a certain embodiment, and are not used to limit a range of the invention. The singular form as used herein is intended to include both the singular and the plural of the term unless it denotes definitely only one case. In addition, terms "comprise" and/or "comprising" used in the present specification includes described forms, numbers, processes, members, elements, and/or the existence of these groups, and does not exclude one or more different forms, numbers, operations, members, elements, and/or the existence or adding of these groups.

The terms "first," "second," and the like, as used herein are used to describe various members, components, regions, layers, and/or sections, however, these members, components, regions, layers, and/or sections are not limited by the above terms. The above terms rather are used to distinguish one member, component, region, layer, or section from another.

In the specification, when a first conductive type means N-type, a second conductive type means P-type. On the other hand, when the first conductive type means P-type, the second conductive type is N-type.

In addition, in the specification, concepts of a high concentration and a low concentration of impurities are relative to each other. For example, a high concentration region of impurities means that a concentration of the impurities is higher than that of a low concentration region of impurities.

FIG. 1 is a cross-sectional view of a bipolar-CMOS-DMOS (BiCDMOS) device formed on a substrate according to an embodiment of the present invention.

Referring to FIG. 1, a first active region 102, in which one of a pair of complementary metal-oxide-semiconductor (CMOS) transistor is formed, a second active region 105, in which a bipolar transistor will be formed, and a third active region 108, in which a double-diffused metal-oxide-semiconductor (DMOS) transistor is formed, are provided on a substrate 100. The bipolar transistor, the CMOS transistor, and the DMOS transistor may be electrically insulated from each other by device isolation regions 140.

Second conductive type impurities are injected as ions into the first active region 102 to form a first buried layer 112 and a first well 122. First conductive type impurities are injected as ions into the first well 122 to form source/drain regions 131. A source electrode 151 and a drain electrode 152 are respectively formed on the source/drain regions 131, and a gate insulating layer 141 is deposited on the substrate between the source and drain regions 131 and a gate electrode 153 is formed on the gate insulation layer 141. The source electrode 151, the drain electrode 152, and the gate electrode 153 may be formed of a polysilicon layer. Contact hole patterns 162 and metallization 163 may be formed on the source electrode 151, the drain electrode 152, and the gate electrode 153.

First conductive type impurities are injected as ions into the second active region 105 to form a second buried layer 115 and a second well 125. An emitter electrode 156, a base electrode 155, and a collector electrode 157 are formed on the substrate and are separated from each other. The emitter electrode 156, the base electrode 155, and the collector electrode 157 may be formed of a polysilicon layer. A second conductive type impurity region 134 is formed in the second well 125 under the base electrode 155, and a second conductive type impurity region 135 is formed to surround the impurity region 136 in the second well 125 under the emitter electrode 156. A first conductive type sinker 116 that extends to the second buried layer 115 is formed in the second well 125 under the collector electrode 157. Contact hole patterns 162 and metallization 163 may be formed on the emitter electrode 156, the base electrode 155, and the collector electrode 157.

In general, forming a BiCMOS device by forming the bipolar transistor and the CMOS transistor on the same substrate is widely known in the art. The present invention provides a BiCDMOS device that is formed by additionally forming the DMOS device in the BiCMOS device so as to have a high voltage property.

First conductive type impurities are injected as ions into the third active region 108 to form a third buried layer 118 and a third well 128. In the third well 128, a second conductive type low concentration impurity region 137 is formed, and a first conductive type high concentration impurity region 138 may be formed in the low concentration impurity region 137. In addition, a second conductive type high concentration impurity region 139 is formed to be adjacent to the first conductive type high concentration impurity region 138.

The second conductive type low concentration impurity region 137 forms a body region in the DMOS transistor. The first conductive type high concentration impurity region 138 forms a source region in the DMOS transistor, and the second conductive type high concentration impurity region 139 forms a contact to the body region 137.

The gate electrode 158 is formed on the substrate with an intervening gate insulating layer 141 between the gate electrode 158 and the substrate, and the drain electrode 159 is insulated from the gate electrode 158 by the device isolation layer 140 is formed on the substrate. A first conductive type sinker 119, which extends to the third buried layer 118, is formed in the third well 128 under the drain electrode 159. Contact hole patterns 162 and metallization 163 may be formed on the source regions 138 and 139, the gate electrode 158, and the drain electrode 159.

Figure 2:
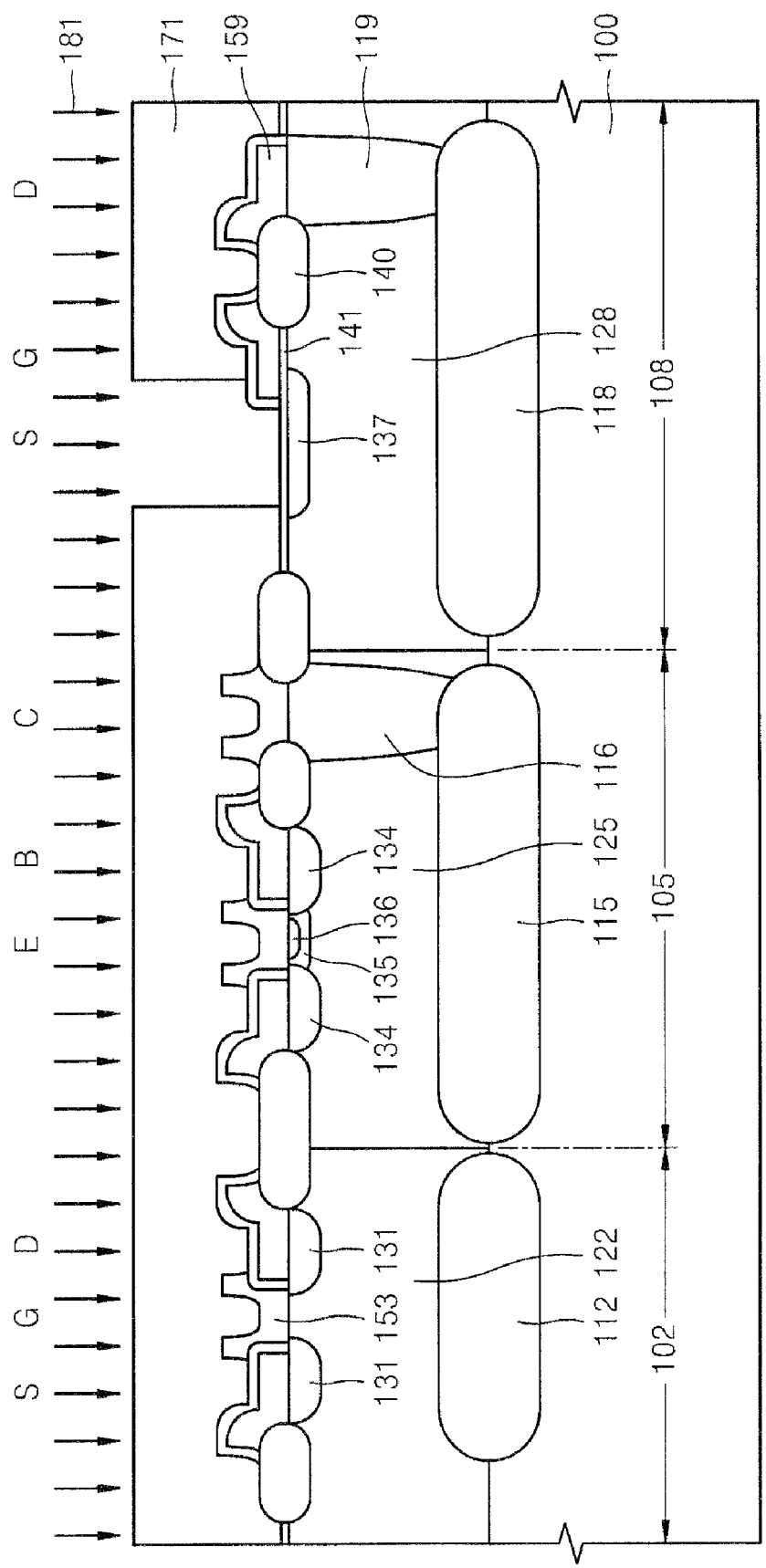
FIGS. 2 through 4 are cross-sectional views illustrating processes of a method of fabricating the BiCDMOS device shown in FIG. 1.
Figure 3:
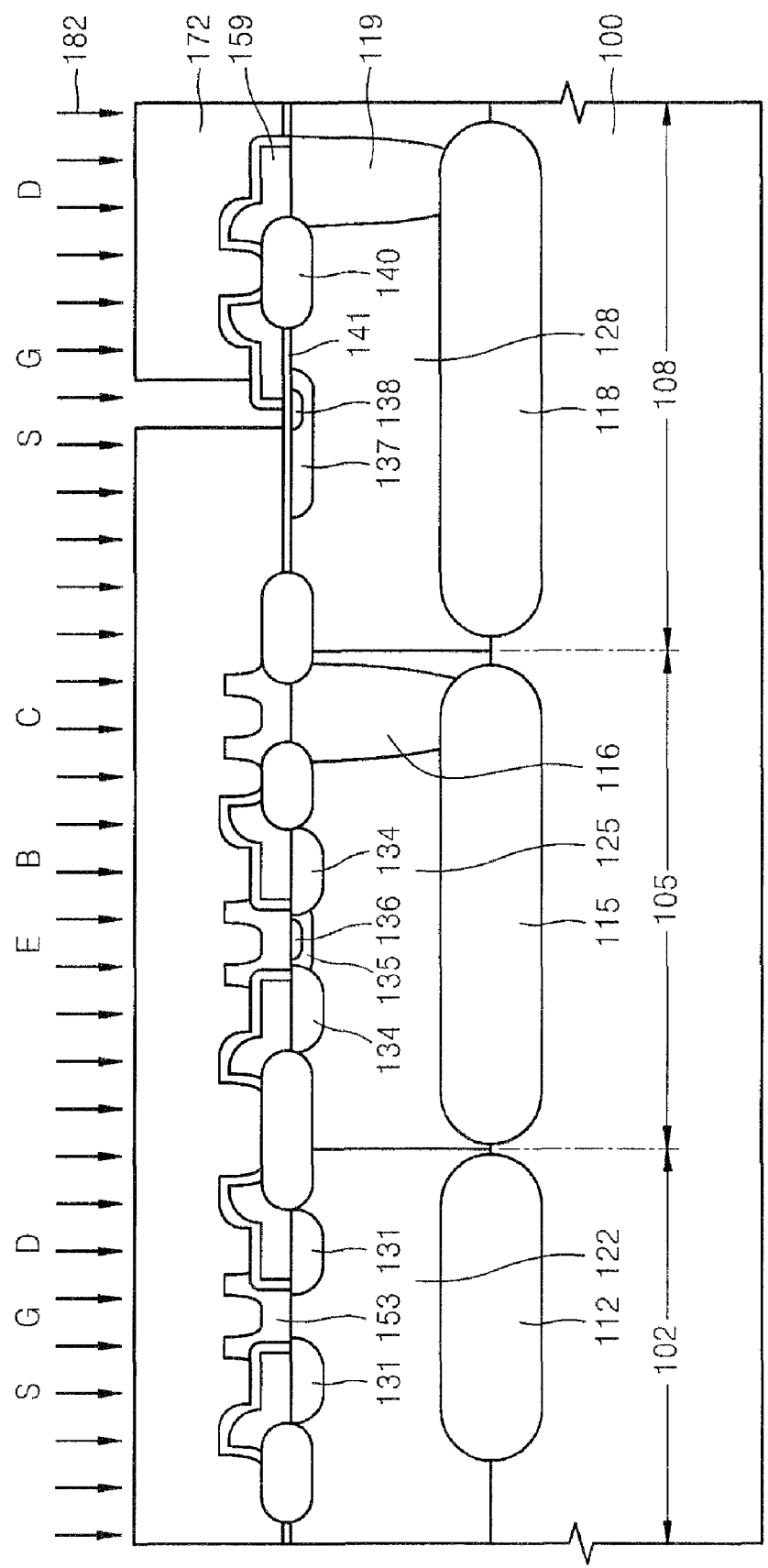
Figure 4:
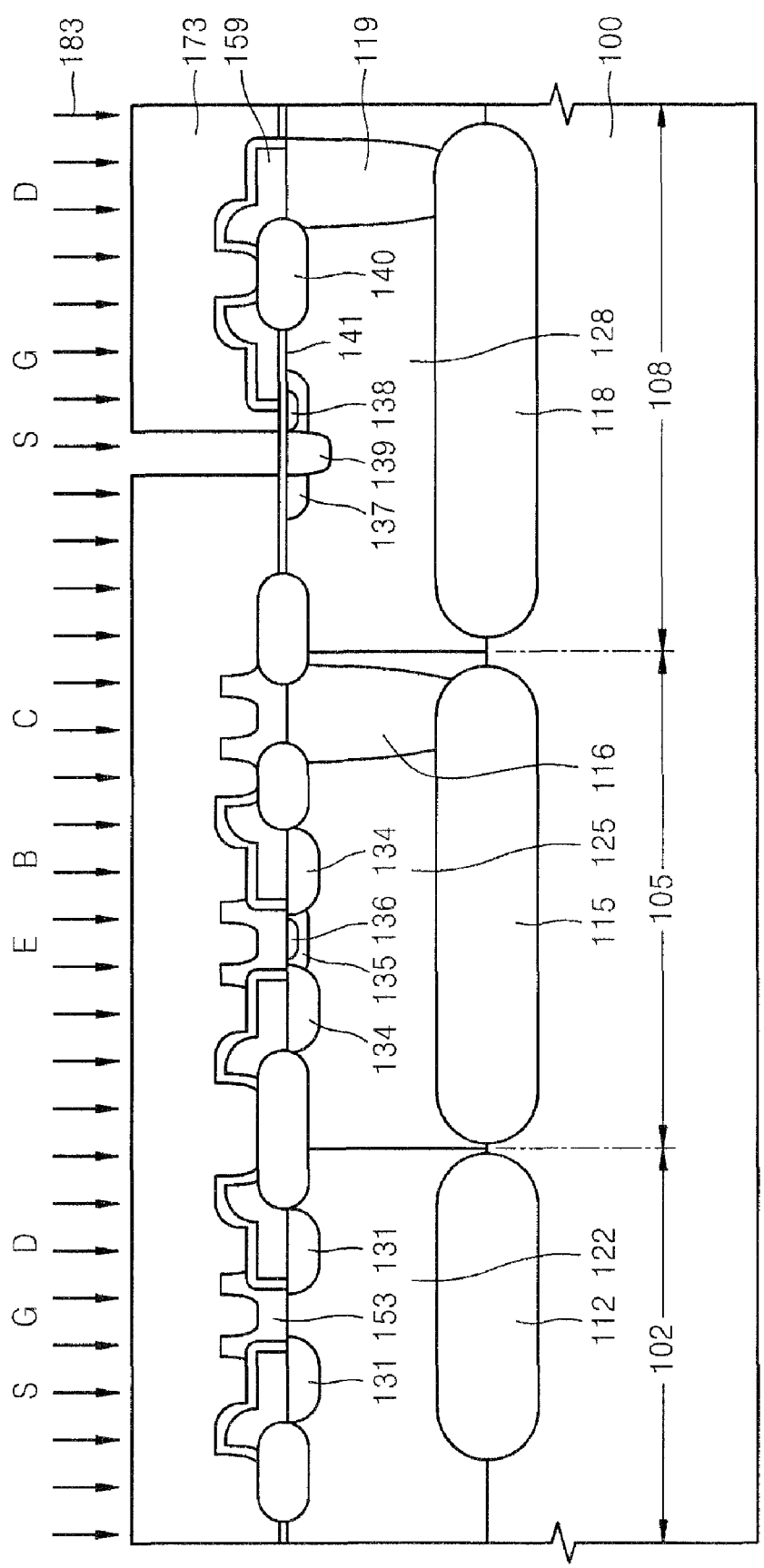

FIGS. 2 through 4 are cross-sectional views illustrating processes in a method of fabricating the DMOS device in the third active region 108 shown in FIG. 1.

Referring to FIG. 2, a first mask layer 171 exposing a portion corresponding to the body region 137 is formed in order to form the body region 137 in the third active region 108. In addition, second conductive type impurities are injected as ions (181) in a low concentration to form the body region 137 that is the second conductive type low concentration impurity region. Two first mask layers 171 are required in order to form a P-type body region when the DMOS device formed in the third active region 108 is an N type DMOS (NDMOS) device, and to form an N-type body region when the DMOS device is a P type DMOS (PDMOS) device.

Referring to FIG. 3, after removing the first mask layer 171, a second mask layer 172 exposes a portion where a high concentration impurity region 138 of a first conductivity type for example N-type, is to be formed in the body region 137. In addition, impurities are injected as ions (182) in a high concentration using the second mask layer 172 to form the first conductive type high concentration impurity region 138. The first conductive type high concentration impurity region 138 corresponds to the source region.

Referring to FIG. 4, after removing the second mask layer 172, a third mask layer 173 exposing a portion corresponding to a second conductive type high concentration impurity region 139, for example, P-type, is formed to form the high concentration impurity region 139 in the body region 137. In addition, impurities are injected as ions (183) in a high concentration using the third mask layer 173 to form the second conductive type high concentration impurity region 139. The second conductive type high concentration impurity region 139 also corresponds to the source region.

As described with reference to FIGS. 2 through 4, in order to form the additional DMOS transistor in the BiCMOS device, fabrication processes become complex and a number of mask layers should be used, and thus, the fabrication costs of the device increase.

Figure 5:
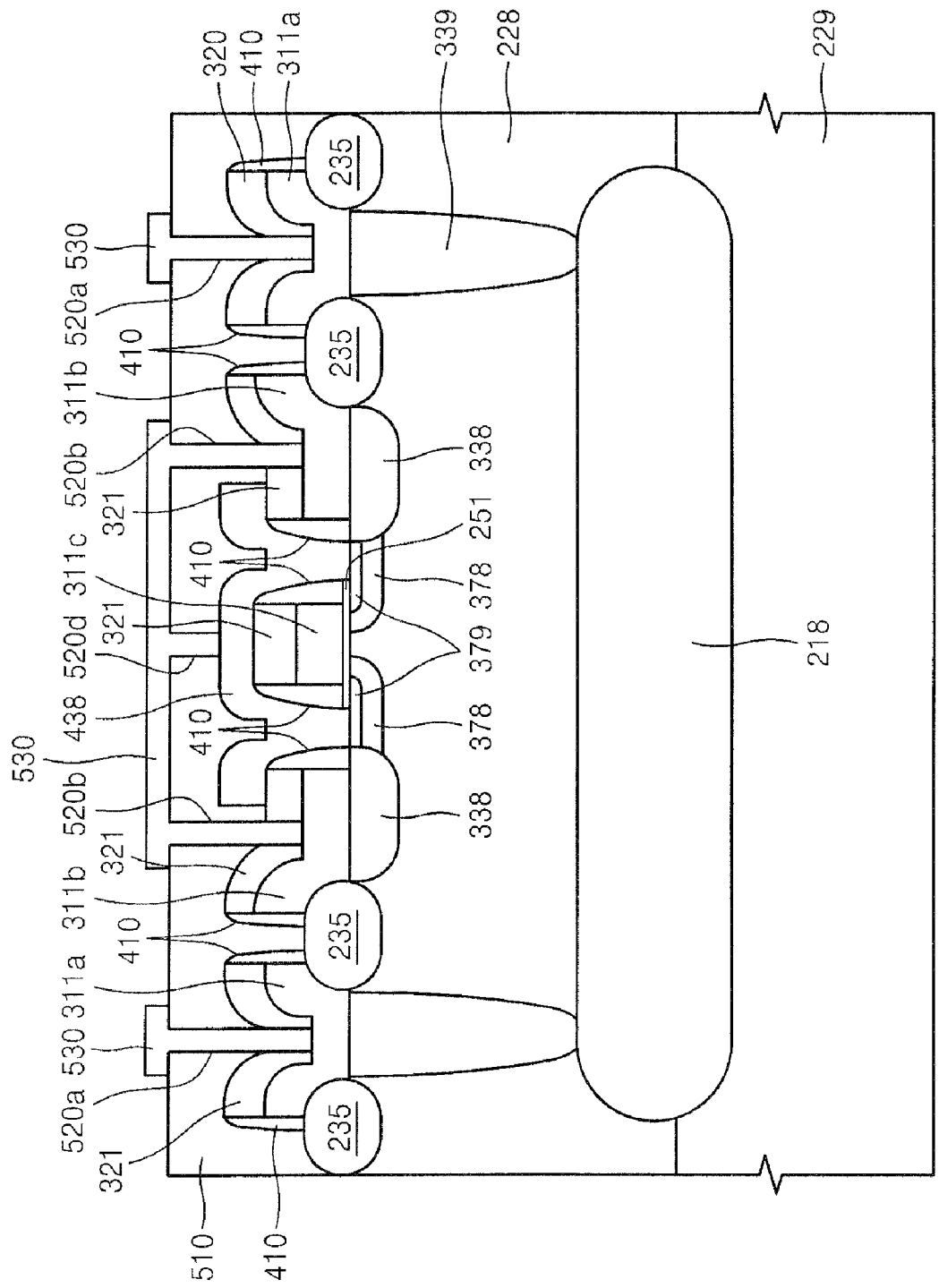
FIG. 5 is a cross-sectional view of a semiconductor device according to an embodiment of the present invention.

FIG. 5 is a cross-sectional view of a semiconductor device according to an embodiment of the present invention.

Referring to FIG. 5, a semiconductor device according to an embodiment of the present invention in the form of a DMOS transistor is shown. In the DMOS transistor, a first conductive type well 228 is formed in a semiconductor substrate 229. A first conductive type gate electrode 311c is formed on the semiconductor substrate with a gate insulating layer 251 between the gate electrode 311c and the semiconductor substrate 229. Second conductive type body electrodes 311b are formed on the semiconductor substrate and are separated from the gate electrode 311c. First conductive type drain electrodes 311a are formed on the semiconductor substrate and are separated from the gate electrode 311c and the body electrodes 311b. A second conductive type first body region 338 is formed in the well 228 under each of the body electrodes 311b. A second conductive type second body region 378 extending from the first body region 338 to the gate insulating layer 251 is formed in the well 228. A first conductive type source region 379 extending from the first body region 338 to the gate insulating layer 251 is formed in the second body region 378. A first conductive type source electrode 438 surrounds the gate electrode 311c and is insulated from the gate electrode 311c by an insulating layer 410 on the side of the gate electrode 311c and by a side insulation layer 320 on top of the gate electrode 311c. The side insulating layers 410 and the top insulating layers 320 may also be on the electrodes 311a and 311b. A first conductive type buried layer 218 may be formed on a lower portion of the well 228 in a transverse direction, and a sinker 339 extending from each of the drain electrodes 311a to the buried layer 218 may be formed.

The impurity concentration of the second conductive region in the first body region 338 may be higher than that of the second body region 378. A first contact hole pattern 520b is formed on each of the body electrodes 311b. A second contact hole pattern 520d is formed on the source electrode 438. Third and fourth contact hole patterns 520a may be formed on each of the drain electrodes 311a. The first, second, third, and fourth contact hole patterns 520b, 520d, and 520a may be formed by forming contact holes in an interlayer dielectric 510 and filling conductive materials into the contact holes. Metallization 530 may be formed in the contact hole patterns 520b, 520d, and 520a, and the first contact hole pattern 520b and the second contact hole pattern 520d may be electrically connected to each other.

Device isolation regions 235 may be further formed between the body electrode 311b and the drain electrodes 311a, and the device isolation regions 235 may be a shallow trench isolation (STI) structure or a local oxidation of silicon (LOCOS) structure.

A DMOS transistor according to the present invention can be formed using a double polysilicon process, and in this case, the gate electrode 311c, the body electrode 311b, and the drain electrode 311a may be formed of a first polysilicon layer and the source electrode 438 may be formed of a second polysilicon layer.

Figure 15:
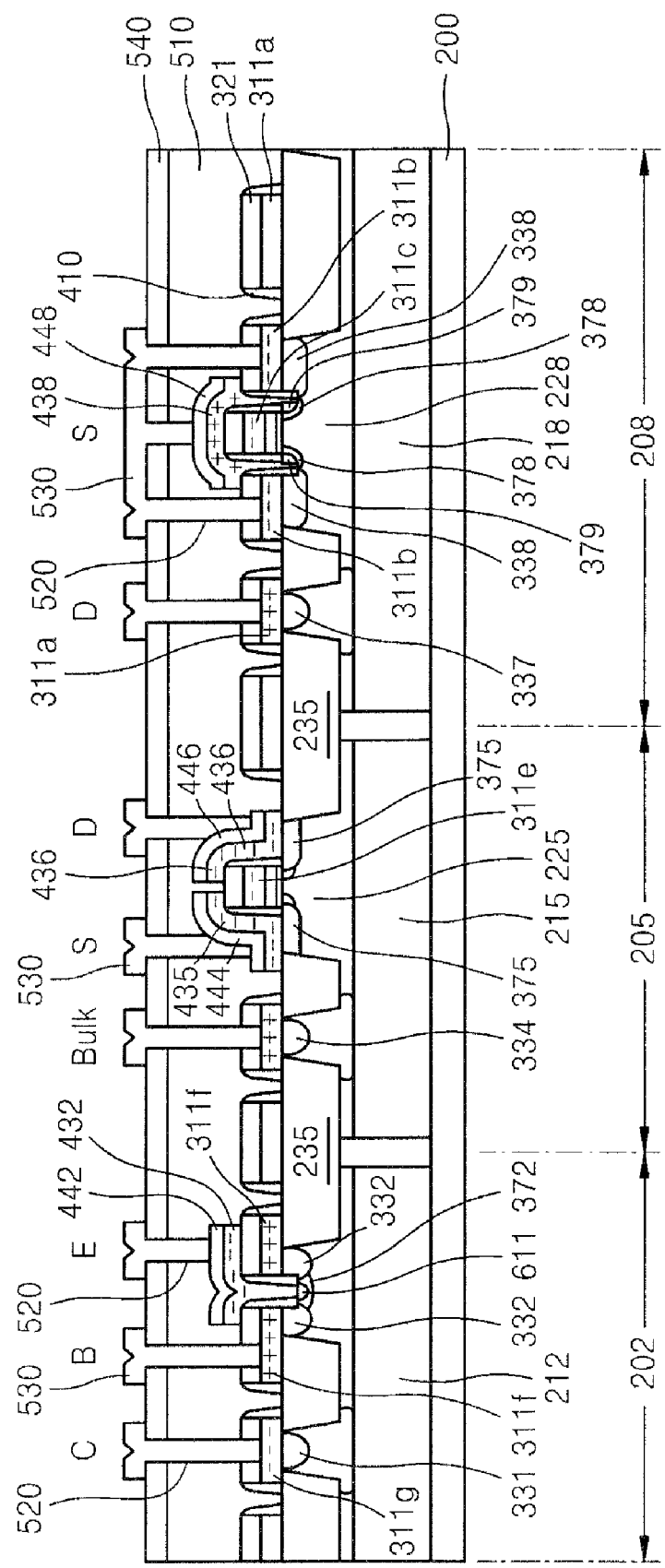
FIG. 15 is a cross-sectional view of a semiconductor device according to another embodiment of the present invention.

FIG. 15 is a cross-sectional view of a semiconductor device according to another embodiment of the present invention.

Referring to FIG. 15, a semiconductor device according to another embodiment of the present invention is a BiCDMOS device, in which a bipolar device, a CMOS device, and a DMOS device are formed on a substrate and are separated from each other in a transverse direction.

The bipolar device includes a second conductive type base electrode 311f, a first conductive type collector electrode 311g, and a first conductive type emitter electrode 432.

The CMOS device includes a first conductive type first gate electrode 311e, a first conductive type first drain electrode 436, a first conductive type first source electrode 435, and a second conductivity type bulk electrode 311d.

The DMOS device includes a first conductive type second gate electrode 311c, a first conductive type body electrode 311b separated from the second gate electrode 311c, second conductive type second drain electrodes 311a and separated from the second gate electrode 311c and the body electrode 311b, a first conductive type first body region 338 formed in a second conductive type well 218 under each of the body electrodes 311b, a first conductive type second body region 378 formed in the well 218 to extend from the first body region to a gate insulating layer 251 under the gate electrode 311c, a second conductive type source region 379 formed in the second body region to extend from the first body region 338 to the gate insulating layer 251, and a second conductive type second source electrode 438 extending from the source region 379 and surrounding the second gate electrode 311c while being separated from the second gate electrode 346 by an insulating layer 410. The first gate electrode 311e, the base electrode 311f, the collector electrode 311g, the bulk electrode 311d, the second gate electrode 311c, the second drain electrode 311a, and the body electrode 311b are formed of first polysilicon layers, and the emitter electrode 432, the first drain electrode 436, the first source electrode 435, and the second source electrode 438 are formed of second polysilicon layers.

FIGS. 6 through 14 are cross-sectional views illustrating a method of fabricating the semiconductor device shown in FIGS. 5 and 15.

Figure 6:
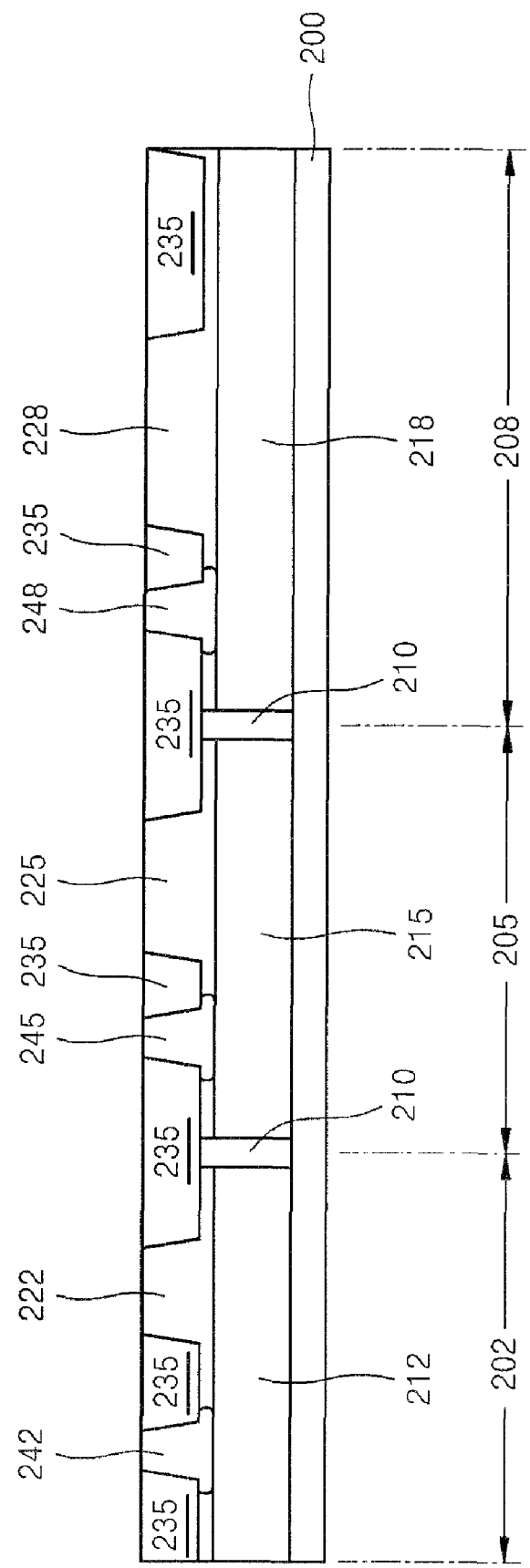
FIGS. 6 through 14 are cross-sectional views illustrating a method of fabricating the semiconductor device shown in FIGS. 5 and 15.

Referring to FIG. 6, a silicon on insulator (SOI) substrate 200 includes a first active region 202, on which the bipolar transistor will be formed, a second active region 205, on which the CMOS transistor will be formed, and a third active region 208, on which the DMOS transistor will be formed, is provided. Buried layers are formed in a lower portion of the 3 active regions, and wells are formed above the buried layers. The process of forming the buried layers includes: forming a buried layer 212 by ion-injecting highly concentrated first conductive type impurities in the first active region 202, forming a buried layer 215 by ion-injecting highly concentrated second conductive type impurities in the second active region 205, and forming a buried layer 218 by ion-injecting highly concentrated second conductive type impurities in the third active region 208. The process of forming the wells includes forming a well 222 by ion-injecting first conductive type impurities in the first active region 202, forming a well 225 by ion-injecting second conductive type impurities in the second active region 205, and forming a well 228 by ion-injecting second conductive type impurities in the third active region 208. Device isolation regions 235 separate the active regions 202, 205, and 208 from each other may be formed. A first conductive type sinker 242, which extends to the buried layer 212, may be formed in the well 212 at a portion corresponding to a portion of the first active region 202, on which a collector electrode will be formed. In addition, a second conductive type sinker 248, which extends to the buried layer 218, may be formed in the well 228 at a portion corresponding to a portion of the third active region 208, on which a drain electrode will be formed.

Figure 7:
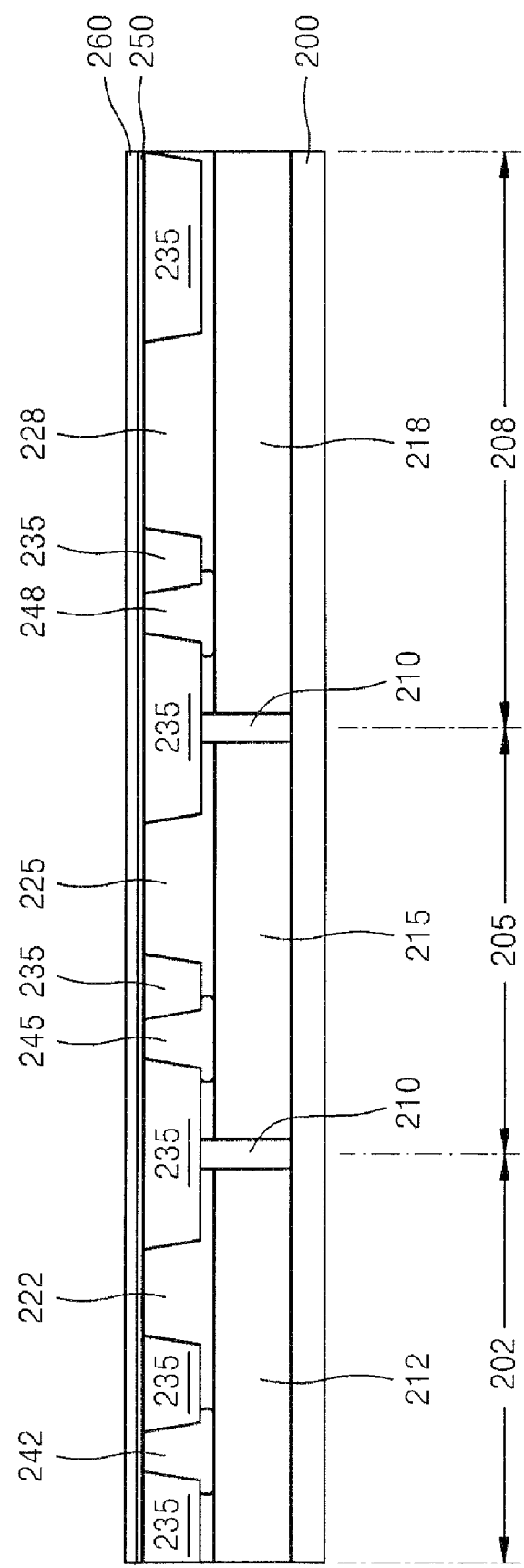

Referring to FIG. 7, a gate insulating layer 250 is formed on the substrate 200. In order to prevent the gate insulating layer 250 from being contaminated by impurities in post-processes, a protective layer 260 may be further formed on the gate insulating layer 250. The protective layer 260 may be formed of a polysilicon layer. Then, an injection of channel ions (not shown) onto the substrate 200 may be performed.

Figure 8:
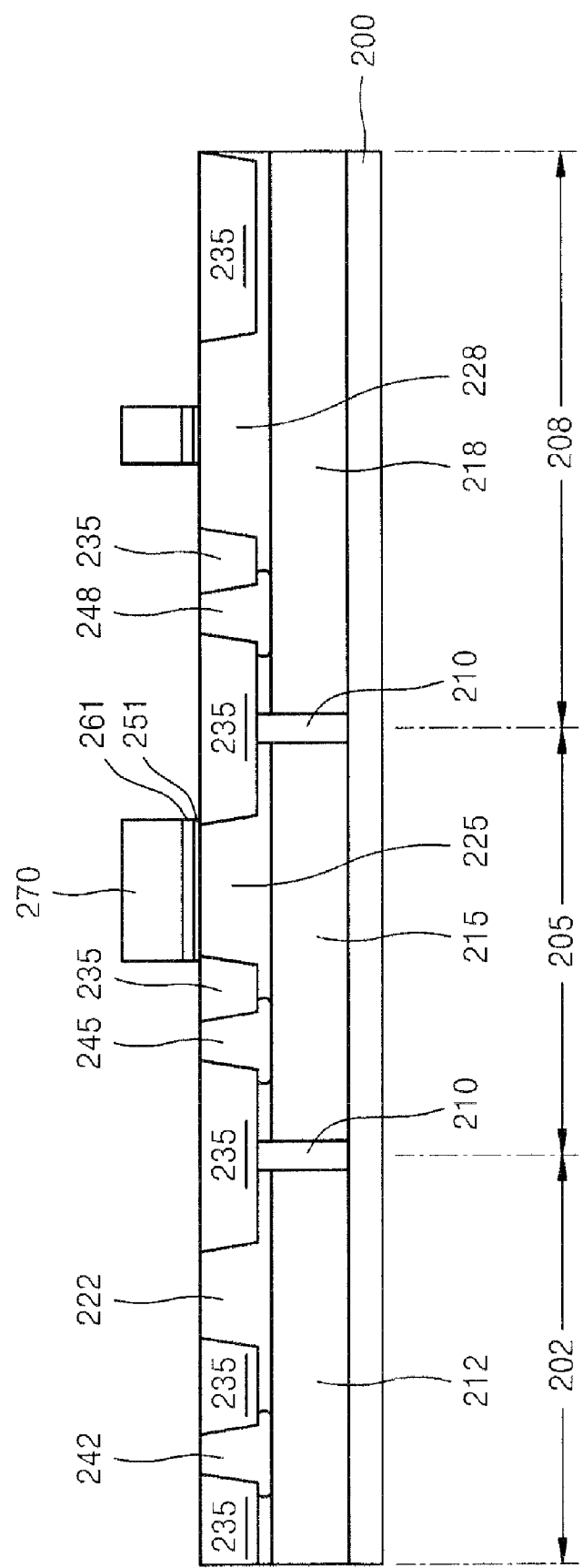

Referring to FIG. 8, a photosensitive layer pattern 270 is formed on the substrate 200 where a first gate electrode and a second gate electrode are to be formed, and after that, the protective layer 260 and the gate insulating layer 250 are etched using the photosensitive layer pattern 270 as an etching mask to form protective layer patterns 261 and gate insulating layer patterns 251.

Figure 9:
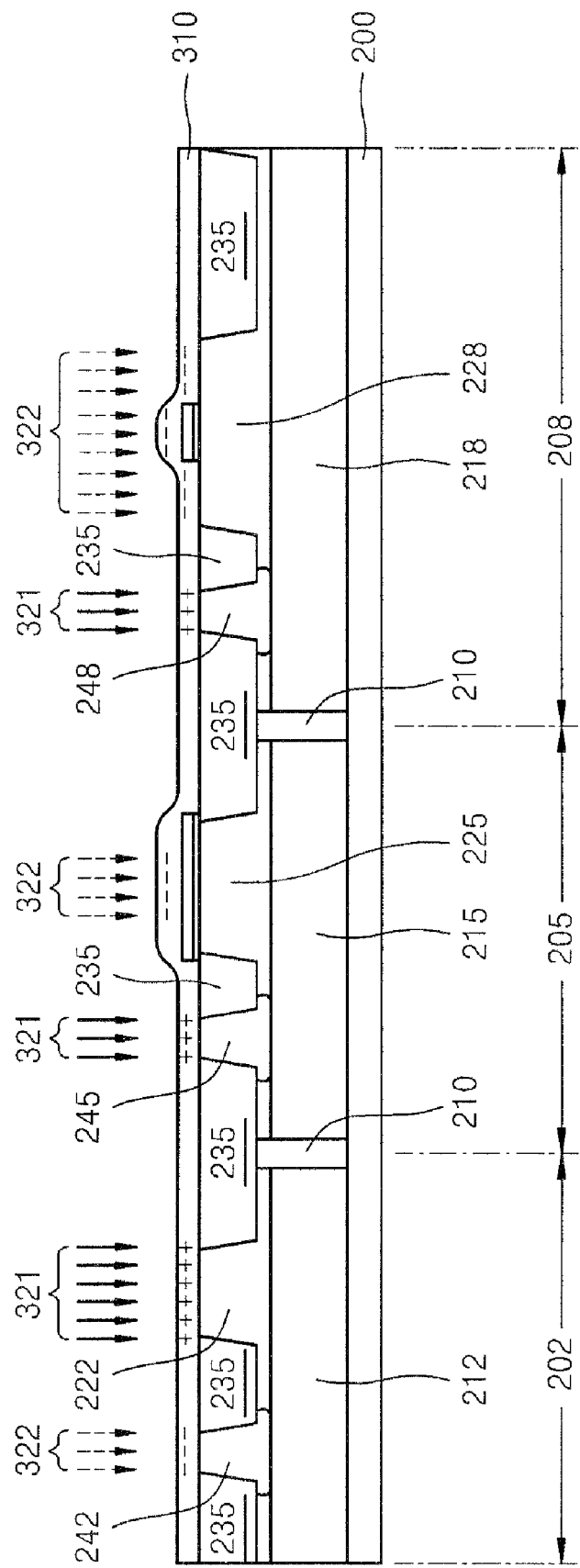

Referring to FIG. 9, a first polysilicon layer 310 is formed on an entire surface of the substrate 200 including the gate insulating layer pattern 251. In addition, a high concentration of first conductive type impurities are injected as ions (322) onto portions of the first polysilicon layer 310, on which the collector electrode, the first gate electrode, the second gate electrode, and the body electrode are to be formed. In addition, a high concentration of second conductive type impurities are injected as ions (321) onto portions of the first polysilicon layer 310, which correspond to portions where the base electrode and the second drain electrode will be formed.

Figure 10:
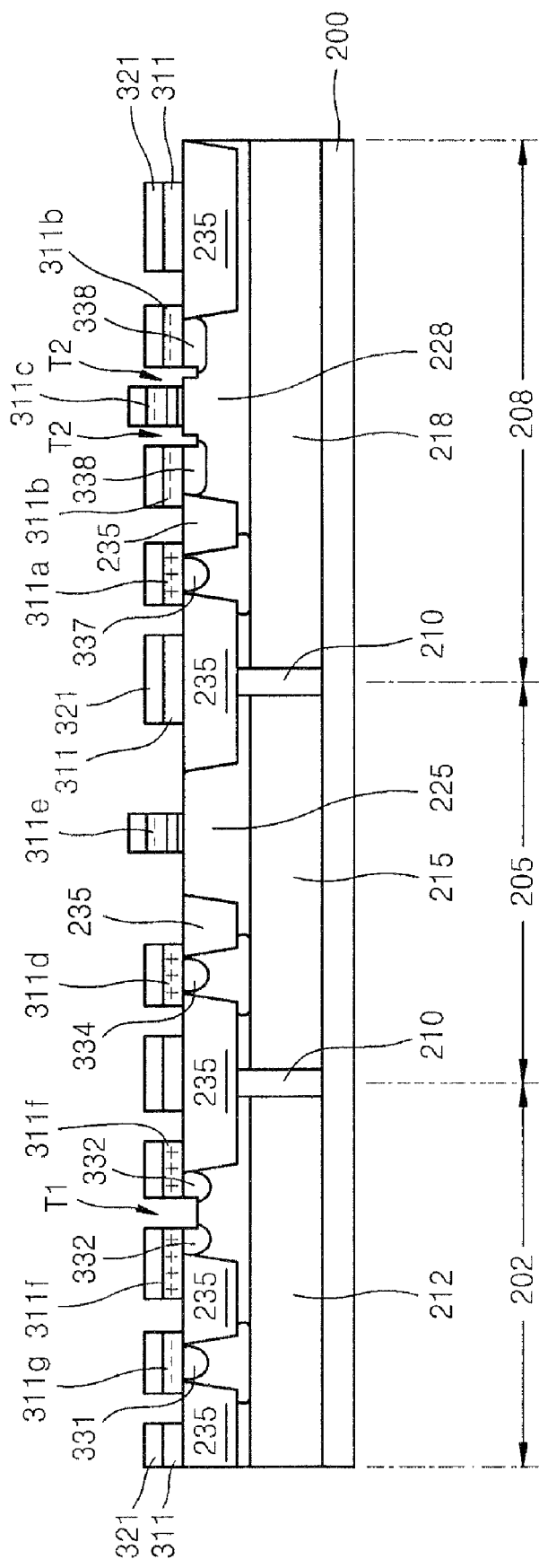

Referring to FIG. 10, the first polysilicon layer 310 is patterned to form the patterned first polysilicond layer 311 including what will be the collector electrode 311g, the base electrode 311f, the first gate electrode 311e, the body electrodes 311b, and the second gate electrode 311c. An oxide layer pattern 321 may be further formed by depositing an oxide layer on the first polysilicon layer 310 as a protective layer and patterning the oxide layer. When the first polysilicon layer 310 is patterned, a trenchs T2 may be formed on the substrate by etching a part of the well 228 between the second gate electrode 311c and the body electrodes 311b. In the first active region 202, a trench T1 may be formed in the center of the base electrode 311f.

In addition, the substrate is thermally treated to form a first conductive type first impurity region 331 in the substrate under the collector electrode 311g, a first conductive type first impurity region 338 in the substrate under the body electrode 311b, a second conductive type first impurity region 332 in the substrate under the base electrode 311f, a second conductivity type first impurity region 334 under the bulk electrode 311d, and a second conductive type first impurity region 337 in the substrate under the second drain electrode 311a.

Figure 11:
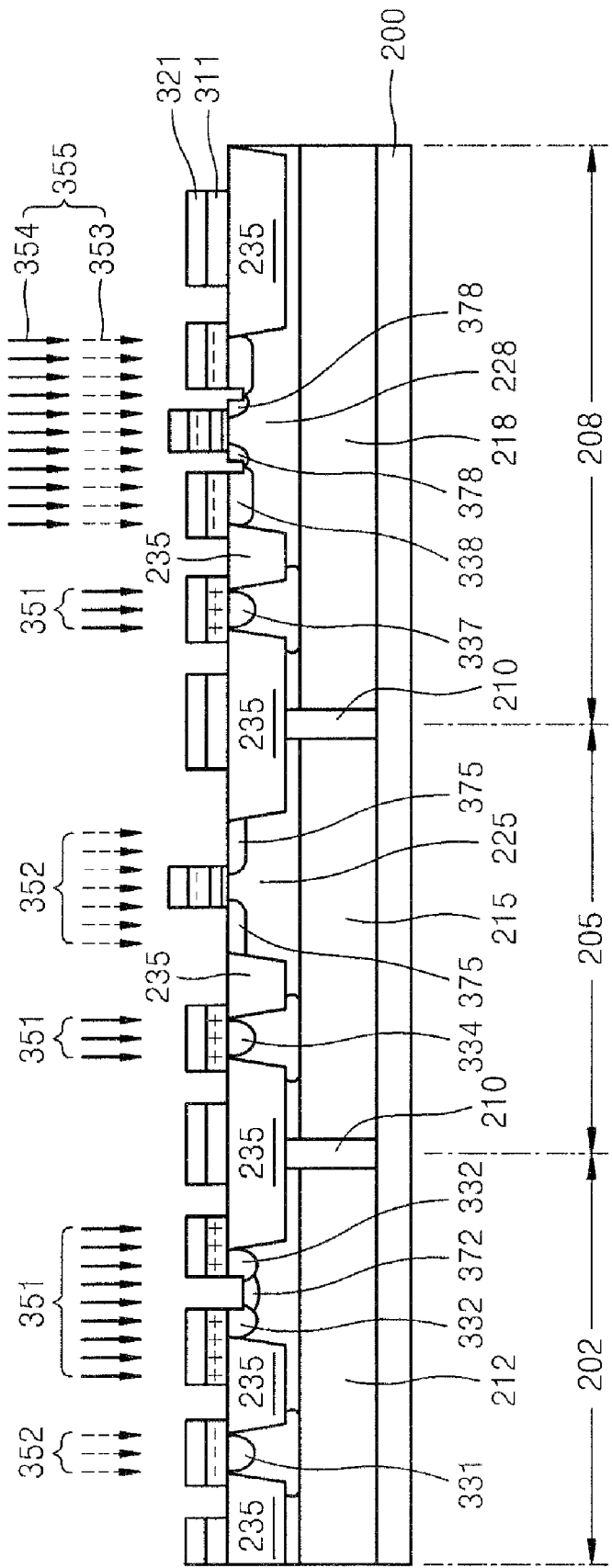
Figure 12:
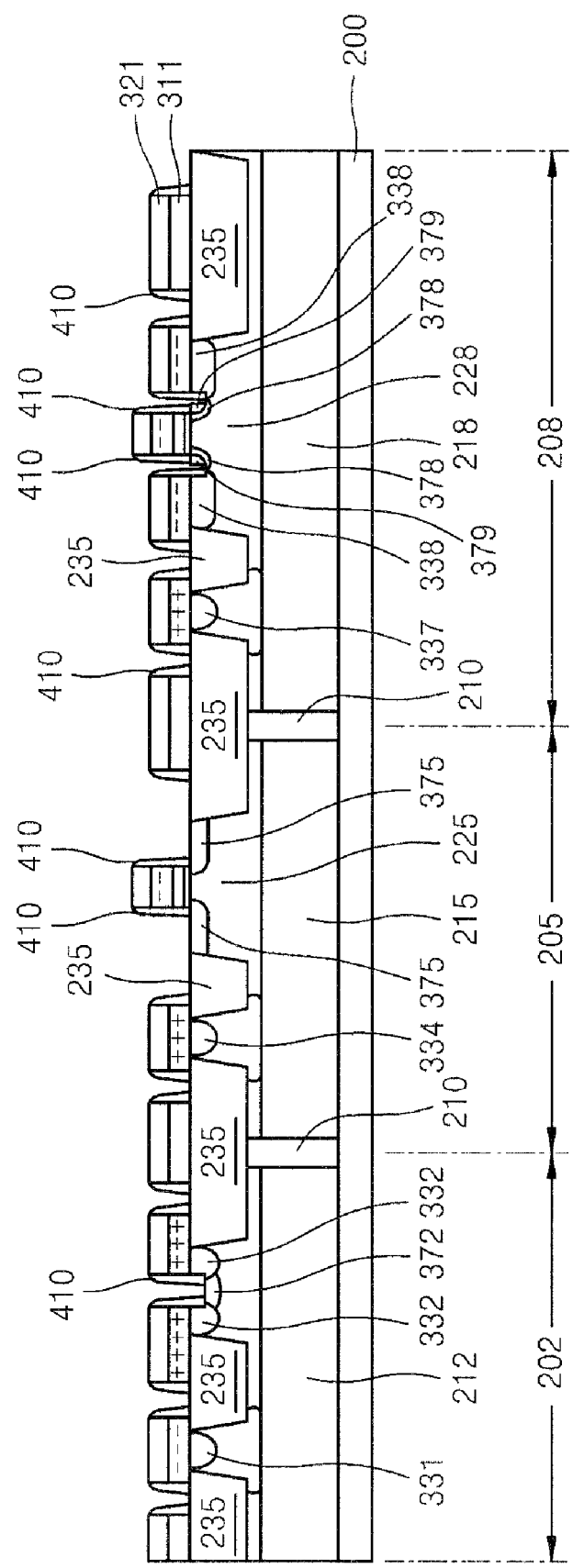

Referring to FIGS. 11 and 12, a low concentration of first conductive type impurities is injected as ions (352) onto the collector electrode 311g, the first gate electrode 311e, and both sides of the first gate electrode 311e. In addition, a low concentration of second conductive type impurities is injected as ions (351) onto the base electrode 311f, the bulk electrode 311d, and the drain electrode 311a. Next, ion injection (335) to form the second body region 378 is performed as follows. A low concentration of first conductive type impurities (353) and second conductive type low concentration impurities (354) are sequentially injected as ions onto the body electrode 311b, the second gate electrode 311c, and between the body electrode 311b and the second gate electrode 311c.

In addition, the substrate is thermally treated again to form the second conductive type second impurity region 372 between the second conductive type first impurity regions 332 in the first active region 202, to form first conductive type second impurity regions 375 on both sides of the first gate electrode in the second active region 205, and to form a second conductive type second impurity region between the second gate electrode 311c and the body electrode 311b and a first conductive type second impurity region 378 to surround the source region 379 in the third active region 208.

In addition, spacer patterns 410 are formed on side surfaces of the patterned layers 311 and 321 including the collector electrode, the base electrode, the first gate electrode, the body electrode, and the second gate electrode.

Figure 13:
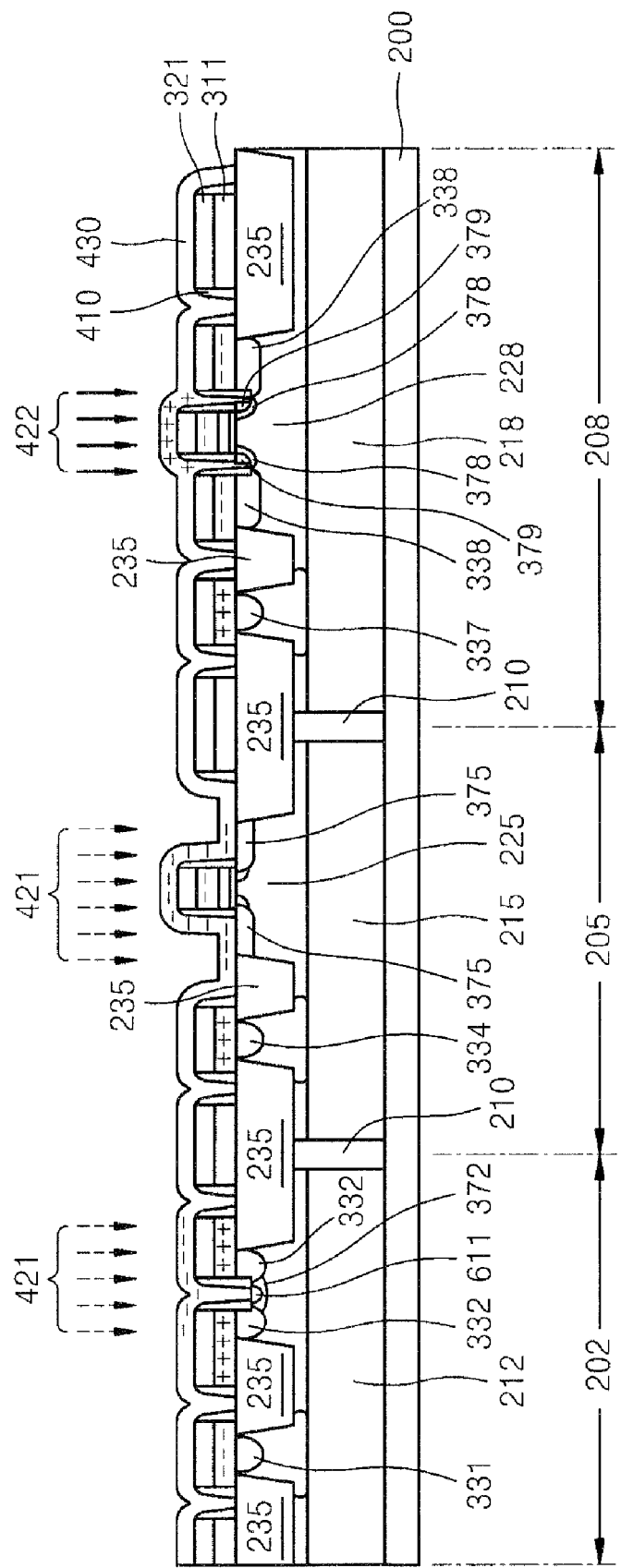

Referring to FIG. 13, a second polysilicon layer 430 is formed on an entire surface of the substrate including the structures on the substrate. Next, a high concentration of first conductive type impurities are injected (421) as ions onto portions of the second polysilicon layer 430, where the emitter electrode 432, the first source electrode 435, and the first drain electrode 436 will be formed, and a high concentration of second conductive type impurities are injected as ions (422) onto a portion of the second polysilicon layer 430, where the second source electrode 438 will be formed. In addition, an oxide layer (not shown) is formed on the entire surface of the substrate, and then, the substrate is thermally treated for a third time. The third thermal treatment may be performed using a rapid thermal process (RTP).

Figure 14:
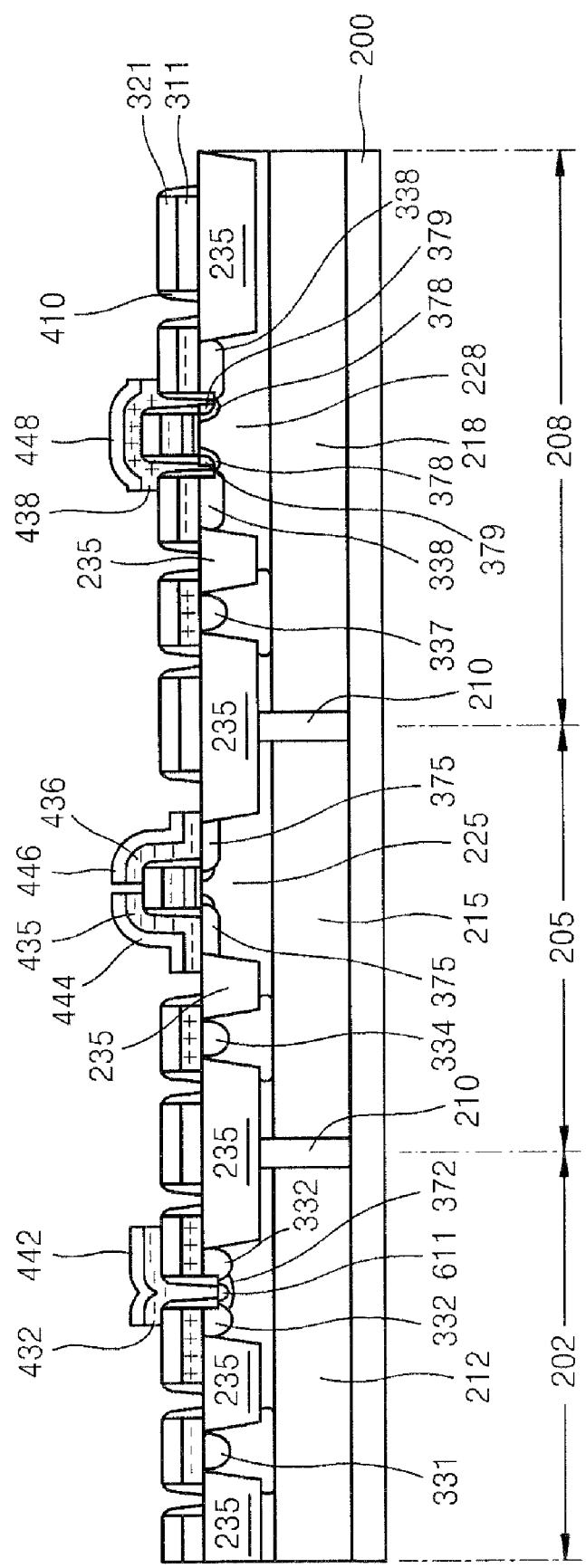

Referring to FIG. 14, the second polysilicon layer 430 is patterned to form the emitter electrode 432, the first source electrode 435, the first drain electrode 436, and the second source electrode 438. A silicide layer (not shown) may be deposited before patterning the second polysilicon layer 430. In this case, silicide layer patterns 442, 445, 446, and 448 may be formed on the emitter electrode 432, the first source electrode 435, the first source electrode 435, the first drain electrode 436, and the second source electrode 438, respectively.

Referring to FIG. 15, an interlayer dielectric 510 is formed on the structure on the substrate. In addition, contact hole patterns 520 are formed on the collector electrode 311g, the base electrode 311f, the emitter electrode silicide 432, the bulk electrode 311*d*, the first source electrode silicide 444, the first drain electrode silicide 446, the second drain electrode 311*a*, the body electrode 311*b*, and the second source electrode silicide 438, and metallization 530 is formed on the contact hole patterns 520. In particular, the contact hole patterns 520 formed on the body electrode 311*b* and the second source electrode 438 may be electrically connected to each other.

Figure 16:
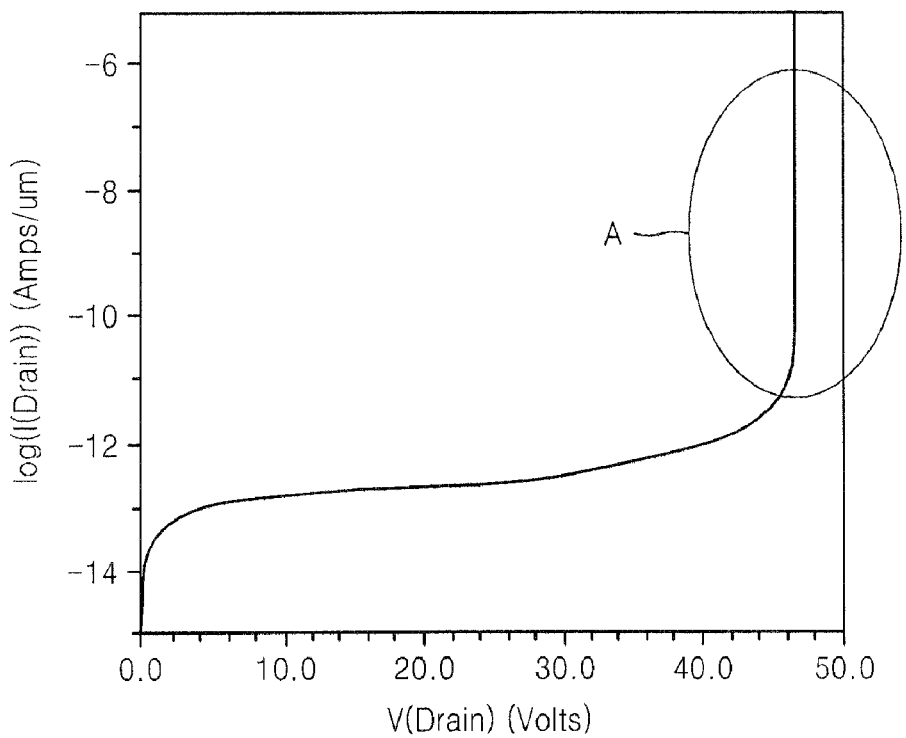
FIG. 16 is a graph showing a relation between a drain voltage and a drain current measured in an n-type double-diffused metal-oxide-semiconductor (DMOS) transistor according to an embodiment of the present invention.
Figure 17:
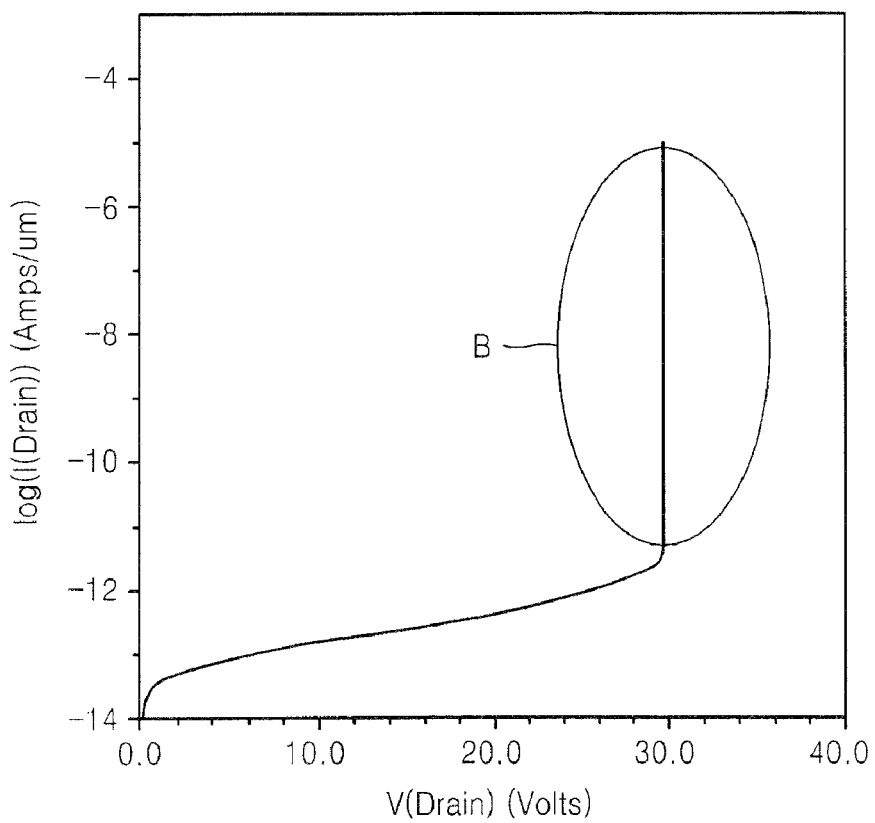
FIG. 17 is a graph showing a relation between a drain voltage and a drain current measured in a p-type DMOS transistor according to an embodiment of the present invention.

FIG. 16 is a graph showing a relation between a drain voltage and a drain current measured in the N type DMOS transistor according to an embodiment of the present invention, and FIG. 17 is a graph showing a relation between a drain voltage and a drain current measured in the P type DMOS transistor according to an embodiment of the present invention.

Referring to FIGS. 16 and 17, withstanding voltage properties are improved in regard to a high frequency performance (A of FIG. 16 and B of FIG. 17).

According to the semiconductor device and the method of fabricating the semiconductor device of the present invention, a BiCDMOS device can be fabricated with reduced fabrication costs due to the use of a small number of mask layers and improved device properties can be provided.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of fabricating a semiconductor device, which forms a DMOS transistor including a gate electrode, a drain electrode, a body electrode, and a source electrode on a substrate, the method comprising:

providing the substrate including an active region, on which the DMOS transistor will be formed;

forming a gate insulating layer pattern on a portion of the substrate, on which the gate electrode will be formed;

forming a first polysilicon layer on an entire substrate including the gate insulating layer pattern;

injecting a high concentration of first conductive type impurities as ions onto portions of the first polysilicon layer, on which the gate electrode and the body electrode will be formed;

injecting a high concentration of second conductive type impurities onto a portion of the first polysilicon layer, on which the drain electrode will be formed;

forming the body electrode and the gate electrode by patterning the first polysilicon layer;

performing a first thermal treatment of the substrate so as to form a first conductive type first impurity region in the substrate under the body electrode, and a second conductive type first impurity region in the substrate under the drain electrode;

sequentially injecting a low concentration of first conductive type impurities and a low concentration of second conductive type impurities as ions onto the body electrode, the gate electrode, and portions between the body electrode and the gate electrode;

performing a second thermal treatment of the substrate so as to form a second conductive type second impurity region and a first conductive type second impurity region between the gate electrode and the body electrode in the active region;

forming a second polysilicon layer on an entire substrate including structures formed on the substrate;

forming the source electrode by by injecting a high concentration of second conductive type impurities onto a portion of the first polysilicon layer, on which the source electrode will be formed and by patterning the second polysilicon layer; and performing a third thermal treatment of the substrate so as to form a second conductive type source region.

2. The method of claim 1 wherein the providing of the substrate further comprises:

forming a buried layer on a lower portion of the substrate and forming the well on the buried layer, wherein the forming of the buried layer comprises: injecting a high concentration of second conductive type impurities as ions onto the active region, and the forming of the well comprises injecting second conductive type impurities in the active region.

3. The method of claim 1, further comprising:

forming contact hole patterns on the drain electrode, the body electrode, and the source electrode after forming the source electrode, wherein the contact hole patterns formed on the body electrode and the source electrode are electrically connected to each other.

4. The method of claim 1, wherein the forming of the body electrode and the gate electrode is performed by etching some of the substrate between the gate electrode and the body electrode to form a trench on the substrate when the first polysilicon layer is patterned.

5. The method of claim 1, wherein the first conductive type is an N type and the second conductive type is a P type, or the first conductive type is the P type and the second conductive type is the N type.

6. A method of fabricating a semiconductor device, which is formed by forming a bipolar transistor including a base electrode, a collector electrode, and an emitter electrode, a CMOS transistor including a first gate electrode, a first drain electrode, and a first source electrode, and a DMOS transistor including a second gate electrode, a second drain electrode, a body electrode, and a second source electrode, on a semiconductor substrate and are separated from each other in a transverse direction, the method comprising:

providing the semiconductor substrate including a first active region, on which the bipolar transistor will be formed, a second active region, on which the CMOS transistor will be formed, and a third active region, on which the DMOS transistor will be formed;

forming a gate insulating layer pattern on portions of the substrate, on which the first gate electrode and the second gate electrode will be formed;

forming a first polysilicon layer on an entire substrate including the gate insulating layer pattern;

injecting a high concentration of first conductive type impurities as ions onto portions of the first polysilicon layer, on which the collector electrode, the first gate electrode, and the body electrode will be formed;

injecting a high concentration of second conductive type impurities onto portions of the first polysilicon layer, on which the base electrode and the second drain electrode will be formed;

forming the collector electrode, the base electrode, the first gate electrode, the body electrode, and the second gate electrode by patterning the first polysilicon layer;

performing a first thermal treatment of the semiconductor substrate so as to form first conductive type first impurity regions in the substrate under the collector electrode and under the body electrode, and second conductive type first impurity regions in the substrate under the base electrode and the second drain electrode;

injecting a low concentration of first conductive type impurities as ions onto the collector electrode, the first gate electrode, and both sides of the first gate electrode;

injecting a low concentration of second conductive type impurities into the base electrode;

sequentially injecting a low concentration of first conductive type impurities and a low concentration of second conductive type impurities as ions onto the body electrode, the second gate electrode, and portions between the body electrode and the second gate electrode;

performing a second thermal treatment of the substrate so as to form a second conductive type second impurity region between the first impurity regions of the second conductive type in the first active region, to form first conductive type second impurity regions on both sides of the first gate electrode in the second active region, and to form a second conductive type second impurity region between the second gate electrode and the body electrode in the third active region and a first conductive type second impurity region surrounding the second conductive type second impurity region;

forming a second polysilicon layer on an entire substrate including structures formed on the substrate;

injecting a high concentration of the first conductive type impurities as ions onto portions of the second polysilicon layer, on which the emitter electrode, the first source electrode, and the first drain electrode will be formed, and performing a third thermal treatment of the substrate; and forming the emitter electrode, the first source electrode, the first drain electrode, and the second source electrode by patterning the second polysilicon layer.

7. The method of claim 6, wherein the providing of the substrate comprises:

forming a buried layer on a lower portion of the substrate, and a well on the buried layer, wherein the forming of the buried layer comprises:

injecting a high concentration of first conductive type impurities as ions into the first active region to form the buried layer;

injecting a high concentration of second conductive type impurities as ions into the second active region to form the buried layer; and injecting a high concentration of second conductive region impurities as ions into the third active region to form the buried layer, and the forming of the well comprises:

injecting first conductive type impurities as ions into the first active region to form the well;

injecting second conductive type impurities as ions into the second active region to form the well; and injecting second conductive type impurities as ions into the third active region to form the well.

8. The method of claim 6, wherein the providing of the substrate further comprises:

forming device isolation layers for defining the first active region, the second active region, and the third active region so as to be insulated from each other.

9. The method of claim 6, wherein the forming of the second polysilicon layer comprises:

forming spacer patterns on side surfaces of the collector electrode, the base electrode, the first gate electrode, the body electrode, and the second gate electrode before forming the second polysilicon layer.

10. The method of claim 6, further comprising:

forming contact hole patterns on the collector electrode, the base electrode, the emitter electrode, the first source electrode, the first drain electrode, the second drain electrode, the body electrode, and the second source electrode after forming the emitter electrode, the first source electrode, the first drain electrode, and the second source electrode, wherein the contact hole patterns formed on the body electrode and the second source electrode are electrically connected to each other.

11. The method of claim 6, wherein the forming of the body electrode and the gate electrode is performed by etching some of the substrate between the second gate electrode and the body electrode to form a trench on the substrate when the first polysilicon layer is patterned.

12. The method of claim 6, wherein the first conductive type is an N type and the second conductive type is a P type, or the first conductive type is the P type and the second conductive type is the N type.

* * * * *